United States Patent
Culp

(10) Patent No.: US 7,517,640 B2
(45) Date of Patent: Apr. 14, 2009

(54) METHOD FOR REMOVING PHOTORESIST USING A THERMAL BAKE IN THE PRESENCE OF HYDROGEN AND A SEMICONDUCTOR DEVICE MANUFACTURED USING THE SAME

(75) Inventor: Donald W. Culp, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 100 days.

(21) Appl. No.: 11/201,930

(22) Filed: Aug. 11, 2005

(65) Prior Publication Data

US 2007/0037357 A1    Feb. 15, 2007

(51) Int. Cl.
*G03F 7/00* (2006.01)
(52) U.S. Cl. ........................ 430/313; 430/325
(58) Field of Classification Search .......... 430/311, 430/313, 325, 330; 216/12, 41, 62
See application file for complete search history.

(56) References Cited

U.S. PATENT DOCUMENTS

| 4,699,689 | A  | * | 10/1987 | Bersin ..................... 438/709 |
| 6,153,455 | A  | * | 11/2000 | Ling et al. ................ 438/231 |
| 6,218,082 | B1 | * | 4/2001  | Yang ....................... 430/325 |
| 6,524,936 | B2 | * | 2/2003  | Hallock et al. ............. 438/531 |
| 6,534,397 | B1 | * | 3/2003  | Okada et al. ............... 438/633 |
| 2005/0079655 | A1 |   | 4/2005  | Chen et al. |

* cited by examiner

*Primary Examiner*—David Vu
(74) *Attorney, Agent, or Firm*—Wade J. Brady, III; Frederick J. Telecky, Jr.

(57) ABSTRACT

The present invention provides a method for removing photoresist, and a method for manufacturing a semiconductor device. The method for removing photoresist, without limitation, may include subjecting a photoresist layer (210) located over a substrate (110) to a thermal bake (410) in the presence of hydrogen, and then removing the photoresist layer (210).

21 Claims, 3 Drawing Sheets

METHOD FOR REMOVING PHOTORESIST USING A THERMAL BAKE IN THE PRESENCE OF HYDROGEN AND A SEMICONDUCTOR DEVICE MANUFACTURED USING THE SAME

TECHNICAL FIELD OF THE INVENTION

The present invention is directed, in general, to a process for removing photoresist and, more specifically, to a method for removing photoresist using a thermal bake in the presence of hydrogen and a semiconductor device manufactured using the same.

BACKGROUND OF THE INVENTION

Photoresist materials are commonly used in a wide number of industrial processes where it is desired to provide detailed patterns on a substrate surface in thin films applied thereto or to provide regions of altered character as contrasted to other surface portions of the substrate. Such photoresist materials are photosensitive in nature, being characterized by differential reactivity to specific liquid solvents after exposure to an energy source, such as ultraviolet radiation, for example. A standard photolithographic practice in employing photoresist layers as patterns involves the application of a layer of photoresist material to a substrate, followed by the selective exposure of the photoresist layer to an energy source, wherein portions of the photoresist layer are changed in character due to their exposure to the energy source. After such exposure, the photoresist layer is then developed by a "wet development process" employing liquid chemical solvents to selectively remove portions of the photoresist for providing the desired pattern therein.

Stripping of the patterned photoresist layer becomes necessary in most instances in the fabrication of an electronic structure after its purpose in providing a patterned mask has been served, such as for the selective application of a thin film to the underlying substrate surface or for the application of dopant materials to selected regions of the substrate, for example. Many fabrication processes for manufacturing discrete electronic devices and integrated circuits require repeated uses of photoresist layers at various stages of the process before the electronic structure is completed. Removal or stripping of each photoresist layer after it has served its purpose in the fabrication of the electronic structure is required before the additional stages in the fabrication process may be accomplished, or at least as the final stage in completing the fabrication of the electronic structure.

Many different processes have, in the past, been employed to remove exposed or unexposed portions of a photoresist layer. Unfortunately, as the industry has evolved, the processes have become problematic in certain situations. One particular situation wherein the processes have become problematic is the situation wherein an implant is implanted through an opening in a photoresist layer. For one reason or another, a hardened skin tends to form on the upper portion of the photoresist layer. The hardened skin, if not removed properly, may cause the solvent within the bulk portion of the photoresist layer to boil during the removal of the photoresist layer. Unfortunately, the boiling of the solvent tends to cause the photoresist to "pop", coating the wafer with undesirable particle defects. These particle defects are often critical defects that lead to yield loss.

Accordingly, what is needed in the art is a method for removing a photoresist layer that does not experience the problems traditionally experienced.

SUMMARY OF THE INVENTION

To address the above-discussed deficiencies of the prior art, the present invention provides a method for removing photoresist, and a method for manufacturing a semiconductor device. The method for removing photoresist, without limitation, may include subjecting a photoresist layer located over a substrate to a thermal bake in the presence of hydrogen, and then removing the photoresist layer.

As previously indicated, the present invention further provides a method for manufacturing a semiconductor device. The method for manufacturing the semiconductor device, in one embodiment, includes implanting a dopant in a substrate through an opening in a photoresist layer located over the substrate, subjecting the photoresist layer located to a thermal bake in the presence of hydrogen, and then removing the photoresist layer.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIGUREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

The present invention is based, at least in part, on the acknowledgement that high dose implants are at least partially responsible for the hardened skin that forms in the upper portion of a photoresist layer after it has been used as an implant mask. The present invention, without being limited to such, is in belief that the high dose implant (i.e., an implant dose of about 1.0E15 atoms/cm$^2$ or greater) tends to cause the photoresist layer subjected thereto to lose hydrogen, and thus carbonize in certain situations. The carbonized hardened skin, in turn, is much more difficult to remove.

Given the aforementioned acknowledgement, the present invention recognized that any process that could be employed to prevent the hardened skin, or alternatively breakdown the hardened skin, could be used to make the photoresist layer easier to remove. Specifically, the present invention recognized that any process that could be employed to re-introduce the hydrogen into the photoresist layer, and more specifically the hardened skin thereby breaking it down, could be used to improve the removal process. Because the hardened skin has been broken down, or is no longer existent, the "popping" effect spoken of earlier could advantageously be reduced, or even eliminated.

In one exemplary embodiment, the present invention recognized that subjecting the photoresist layer having been used as a high dose implant mask to a thermal bake in the presence of hydrogen, could be used to assist in its removal. The photoresist layer having been subjected to the thermal bake could then be removed, for example using a plasma ashing process having one or more steps. However, since the thermal bake had previously been performed, the "popping" issue spoken of above would have been reduced, if not eliminated.

Turning now to FIGS. 1-5, illustrated are cross-sectional views illustrating how one skilled in the art might manufacture a semiconductor device in accordance with the principles of the present invention. While FIGS. 1-5 are specifically directed to the manufacture of a semiconductor device, FIGS. 1-5 also illustrate, in a broad sense, how one skilled in the art might remove photoresist in accordance with the principles of the present invention. Thus, a method for removing photoresist is discussed within the confines of discussing how one skilled in the art might manufacture a semiconductor device with respect to FIGS. 1-5. Nevertheless, while each of these ideas is discussed and illustrated using a single set of FIGURES, neither should be limiting on the other.

Figure 1:
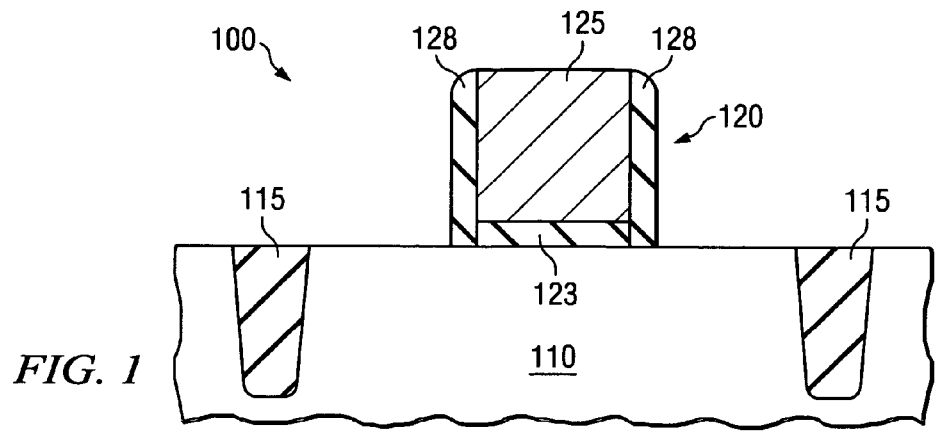
FIG. 1 illustrates a cross-sectional view of semiconductor device at an initial stage of manufacture.

FIG. 1 illustrates a cross-sectional view of semiconductor device 100 at an initial stage of manufacture. The semiconductor device 100 illustrated in FIG. 1 initially includes a substrate 110. The substrate 110 may, in an exemplary embodiment, be any layer located in the partially completed semiconductor device 100, including a wafer itself or a layer located above the wafer (e.g., epitaxial layer). Moreover, the substrate 110 is generally formed from a semiconductor material, such as silicon or polysilicon. The substrate 110 may also be formed from other materials such as gallium arsenide, germanium, silicon-germanium, epitaxial formations, silicon carbide, indium phosphide, silicon-on-insulator substrates (SOI), strained silicon substrates, and/or other semiconductor substrate materials. Nevertheless, in the illustrative embodiment shown, the substrate 110 comprises an epitaxial silicon layer.

Formed within the substrate 110 are isolation structures 115. The isolation structures 115 illustrated in FIG. 1 happen to be shallow trench isolation structures, nevertheless, other embodiments exist wherein the isolation structures differ from those shown. For example, another known embodiment uses field oxide isolation structures in place of the shallow trench isolation structures shown.

Conventionally formed over the substrate 110 and between the isolation structures 115 is a gate structure 120. As is illustrated in FIG. 1, the gate structure 120 includes a gate dielectric 123, a gate electrode 125, and sidewall spacers 128. As the gate structure 120 is conventional, those skilled in the art understand the standard steps used for its manufacture, including blanket depositing both a gate dielectric layer and a gate electrode layer and subsequently using photolithography to define the gate structure 120. The gate dielectric 123, among others, may comprise a high-k dielectric without departing from the scope of the present invention. Similarly, the gate electrode 125, among others, may comprise a metal gate material or polysilicon, without departing from the scope present invention. Likewise, the sidewall spacers 128, among others, may include one or more of a collection of oxide layers and nitride layers.

Figure 2:
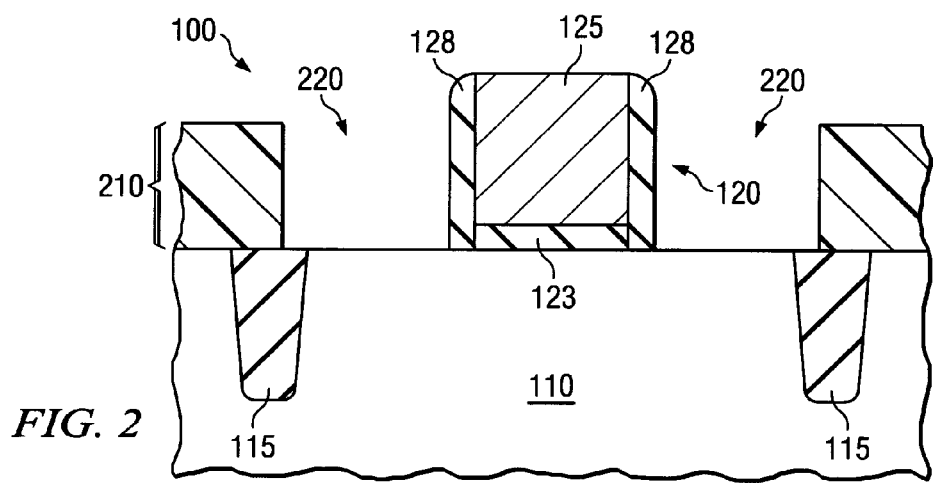
FIG. 2 illustrates a cross-sectional view of the partially completed semiconductor device illustrated in FIG. 1 after forming a patterned photoresist layer over the substrate.

Turning now to FIG. 2, illustrated is a cross-sectional view of the partially completed semiconductor device 100 illustrated in FIG. 1 after forming a patterned photoresist layer 210 over the substrate 110. As is illustrated in FIG. 2, the patterned photoresist layer 210 has one or more openings 220 therein. The openings 220 in the patterned photoresist layer 210 expose a portion of the substrate 110 on opposing sides of the gate structure 120, such as where conventional source/drain regions might be located. In turn, the patterned photoresist layer 210 remains over those portions of the substrate 110 that are desired to be protected.

Those skilled in the art appreciate the conventional process generally used to form the patterned photoresist layer 210. For example, those skilled in the art understand that the patterned photoresist layer 210 is generally formed by first spin-coating a thin photoresist layer over the entire substrate 110. The thin photoresist layer is then selectively (e.g., using a mask) exposed to an energy source, the energy source changing the character of the thin photoresist layer. After such exposure, the thin photoresist layer is then developed by a "wet development process" employing liquid chemical solvents to selectively remove portions of the thin photoresist layer, thus providing the photoresist layer 210 having the openings 220 therein.

Figure 3:
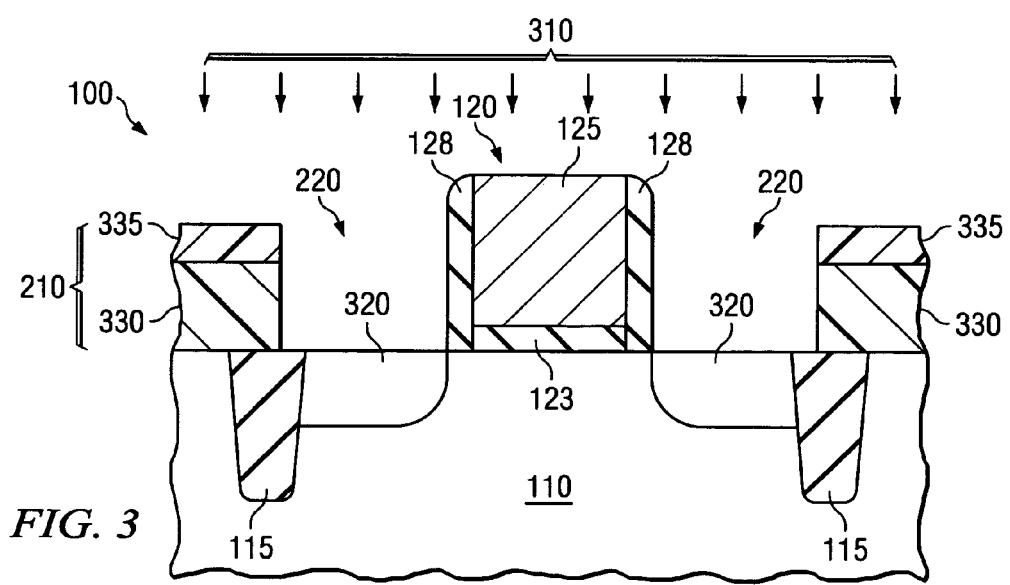
FIG. 3 illustrates a cross-sectional view of the partially completed semiconductor device illustrated in FIG. 2 after implanting a dopant into the substrate through the openings in the photoresist layer.

Turning now to FIG. 3, illustrated is a cross-sectional view of the partially completed semiconductor device 100 illustrated in FIG. 2 after implanting a dopant 310 into the substrate 110 through the openings 220 in the photoresist layer 210. As is illustrated, source/drain regions 320 result from the dopant 310 being implanted into the substrate 110. The source/drain regions 320 ideally have a dopant concentration ranging from about 1E17 atoms/cm$^3$ to about 1E22 atoms/cm$^3$, and extend from the gate structure 120 to the isolation structures 115.

The source/drain regions 320 may be formed using conventional processes. For example, the source/drain regions 320 are generally formed using a high dose, such as an implant dose of about 1.0E15 atoms/cm$^2$ or greater. In one exemplary embodiment, the source/drain regions 320 would likely be doped with a dose ranging from about 2.0E15 atoms/cm$^2$ to about 9.0E15 atoms/cm$^2$ and at an energy ranging from about 3.0 keV to about 55 keV. Other implant conditions are, however, within the purview of the present invention.

As is noticeable in FIG. 3, the implant 310 tends to negatively affect the photoresist layer 210, thereby causing the photoresist layer 210 to have a hardened skin portion 335, in addition to a bulk portion 330. As was indicated above, it is believed that the hardened skin portion 335 results from the high dose implant removing at least a portion of the hydrogen therefrom, thus causing it to be a carbonized hardened skin portion.

Figure 4:
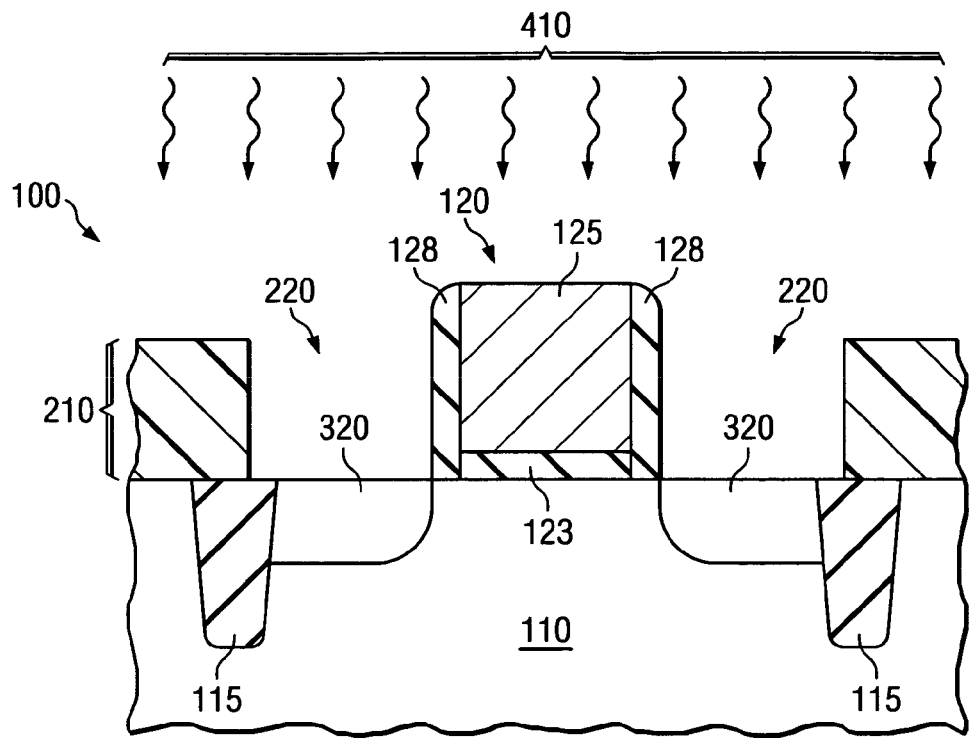
FIG. 4 illustrates a cross-sectional view of the partially completed semiconductor device illustrated in FIG. 3 after subjecting the photoresist layer to a thermal bake in the presence of hydrogen.

Turning now to FIG. 4, illustrated is a cross-sectional view of the partially completed semiconductor device 100 illustrated in FIG. 3 after subjecting the photoresist layer 210 to a thermal bake 410 in the presence of hydrogen, such as in the presence of a forming gas (e.g., $N_2H_2$). The thermal bake 410 is advantageously performed prior to any attempt to remove the patterned photoresist layer 210. In an exemplary embodiment, the thermal bake 410 is performed prior to any plasma ashing steps. As such, the patterned photoresist layer 210, and particularly the hardened skin portion 335, has yet to be subjected to an oxygen source. It is believed that subjecting the patterned photoresist layer 210 to an oxygen source prior to the thermal bake 410, may cause any dopants trapped within the hardened skin portion 335 to oxidize, and thus be further trapped therein. It is further believed that such oxidized dopants enhance the structural integrity of the hardened skin portion 335, thus making it more difficult to remove, which is undesirable.

The specific conditions of the thermal bake 410 may vary greatly while staying within the scope of the present invention. For instance, in one advantageous embodiment of the present invention, the thermal bake 410 uses a temperature ranging from about 120° C. to about 160° C. However, in an alternative exemplary embodiment, the thermal bake 410 uses a temperature ranging from about 140° C. to about 150° C. Similarly, the thermal bake 410 could be conducted, among other periods of time, for a period of time of less than about 6 minutes. In another exemplary embodiment, the thermal bake 410 is conducted for a period of time ranging from about 90 seconds to about 150 seconds. Similarly, a flow rate of a forming gas ranging from about 1500 sccm to about 2500 sccm, and particularly about 1900 sccm, could also be used. While ranges for the temperature, time, and flow rates have been given for the thermal bake 410, the present invention should not be limited to those ranges, and thus temperatures, times, and flow rates outside of the aforementioned ranges may exist.

The thermal bake 410 in the presence of hydrogen advantageously helps break down the hardened skin portion 335. In an exemplary embodiment, the thermal bake 410 reintroduces hydrogen into the hardened skin portion 335, making it become more similar to its original (e.g. pre-implant) state, and thus the bulk portion 330. The thermal bake is a non-plasma process. Moreover, it is believed that the thermal bake 410 heats the photoresist layer 210 prior to its removal, thus volatizing more of the solvent therefrom. With the solvent in the photoresist layer 210 being reduced, the possibility for "popping" is further reduced. A wafer cross-section of a photoresist layer 210 subjected to the thermal bake 410 indicates that the photoresist layer 210 is more brittle after the thermal bake 410 than before, and thus should be more easily removed.

Figure 5:
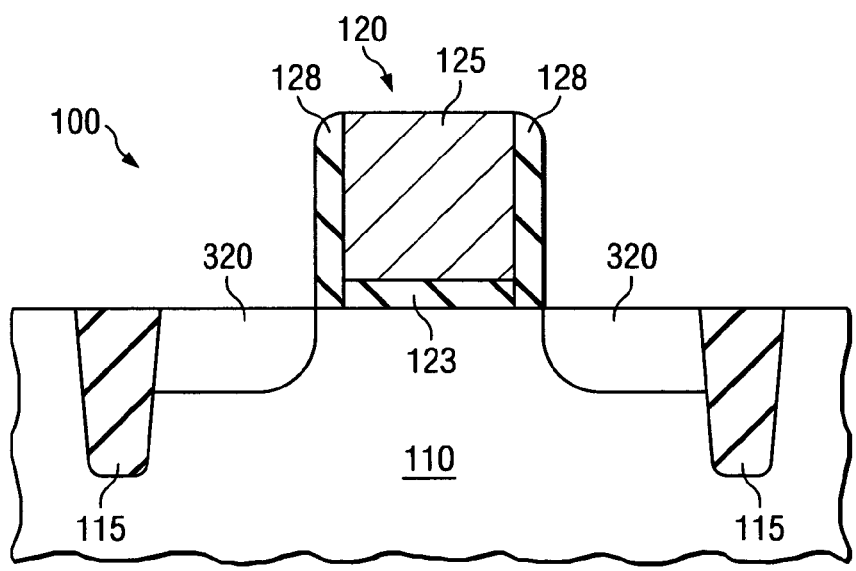
FIG. 5 illustrates a cross-sectional view of the partially completed semiconductor device illustrated in FIG. 4 after removing the photoresist layer having been subjected to the thermal bake.

Turning to FIG. 5, illustrated is a cross-sectional view of the partially completed semiconductor device 100 illustrated in FIG. 4 after removing the photoresist layer 210 having been subjected to the thermal bake 410. The photoresist layer 210 having been subjected to the thermal bake 410 may be removed using a number of different processes. However, one embodiment consistent with the present invention includes plasma ashing the photoresist layer for its removal. For instance, a single or multi-step plasma ashing process might be used. If a single-step plasma ashing process were to be used, it would tend to be a high temperature plasma ash using a temperature ranging from about 180° C. to about 270° C. The plasma might use from about 1000 sccm to about 3000 sccm, and more particularly from about 1500 sccm to about 2500 sccm, of oxygen with from about 100 sccm to about 1000 sccm, and more particularly from about 200 sccm to about 400 sccm, of the forming gas. Similarly, the plasma might use, without being limited to such, a pressure ranging from about 0.5 torr to about 2.0 torr, and a microwave plasma power ranging from about 1000 watts to about 2000 watts.

In the embodiment wherein a multi-step plasma ashing process is used, a first low temperature plasma ash using a temperature ranging from about 120° C. to about 160° C. might precede the aforementioned high temperature plasma ash. The low temperature plasma ash would typically use the same gasses, flow rates, pressures and microwave plasma powers as discussed above for the high temperature plasma ash. In this embodiment, the low temperature plasma ash would advantageously remove at least a portion of any remaining hardened skin portion, and the following high temperature plasma would remove the remainder of the hardened skin portion and at least a portion, if not all, of the bulk portion.

The process described above with respect to FIGS. 1-5 illustrates that the implanting is that of source/drain regions. It should be noted that the same principles might be used for many other implant steps within the formation of a semiconductor device. For example, in certain instances the implantation step might be that of standard source/drain extension implant regions, or alternatively pocket/halo implant regions. Others neither listed nor described also exist.

Figure 6:
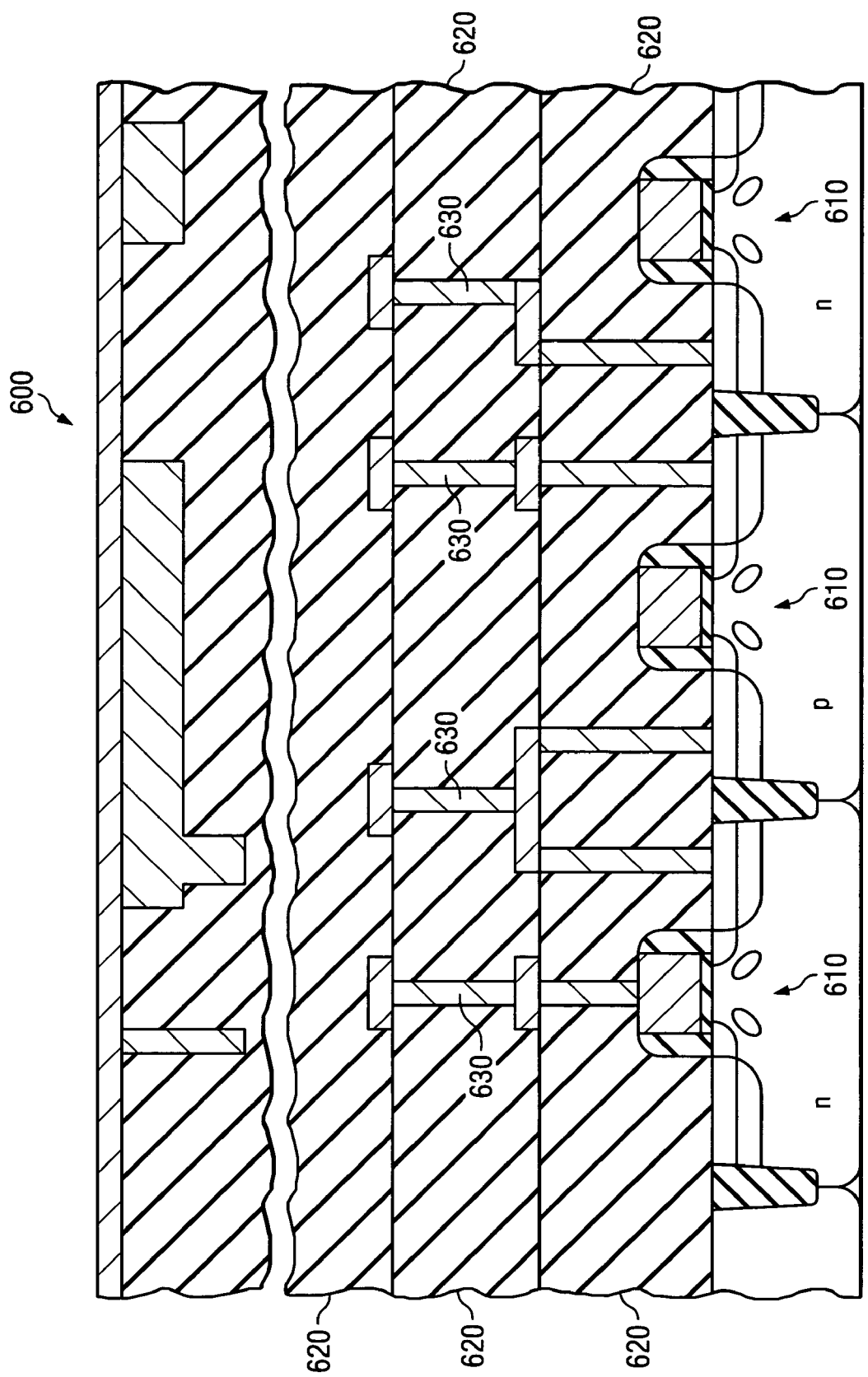
FIG. 6 illustrates a cross-sectional view of a conventional integrated circuit (IC) incorporating semiconductor devices constructed according to the principles of the present invention.

Referring finally to FIG. 6, illustrated is a cross-sectional view of a conventional integrated circuit (IC) 600 incorporating semiconductor devices 610 constructed according to the principles of the present invention. The IC 600 may include devices, such as transistors used to form CMOS devices, BiCMOS devices, Bipolar devices, or other types of devices. The IC 600 may further include passive devices, such as inductors or resistors, or it may also include optical devices or optoelectronic devices. Those skilled in the art are familiar with these various types of devices and their manufacture. In the particular embodiment illustrated in FIG. 6, the IC 600 includes the semiconductor devices 610 having dielectric layers 620 located thereover. Additionally, interconnect structures 630 are located within the dielectric layers 620 to interconnect various devices, thus, forming the operational integrated circuit 600.

Although the present invention has been described in detail, those skilled in the art should understand that they could make various changes, substitutions and alterations herein without departing from the spirit and scope of the invention in its broadest form.

What is claimed is:

1. A method for stripping a patterned photoresist located over a substrate, comprising:
    subjecting the patterned photoresist layer to a thermal bake in the presence of hydrogen; and
    removing the photoresist layer,
    wherein the thermal bake in the presence of hydrogen is a non-plasma process carried out prior to the step of removing the photoresist layer.

2. The method as recited in claim 1 wherein subjecting in the presence of hydrogen includes subjecting in the presence of a forming gas comprising $N_2H_2$.

3. The method as recited in claim 1 wherein subjecting includes subjecting using a temperature ranging from about 140° C. to about 150° C.

4. The method as recited in claim 1 wherein subjecting includes subjecting for a period of time ranging from about 90 seconds to about 150 seconds.

5. The method as recited in claim 1 wherein removing the photoresist layer includes plasma ashing the photoresist layer.

6. The method as recited in claim 5 wherein the plasma ashing includes a high temperature plasma ash using a temperature ranging from about 180° C. to about 270° C.

7. The method as recited in claim 6 wherein the plasma ashing further includes a low temperature plasma ash using a temperature ranging from about 120° C. to about 160° C.

8. The method as recited in claim 7 wherein the low temperature plasma ash occurs before the high temperature plasma ash.

9. The method as recited in claim 1 wherein the thermal bake introduces hydrogen into the photoresist layer.

10. A method for manufacturing a semiconductor device, comprising:
    implanting a dopant in a substrate through an opening in a photoresist layer located over the substrate;
    following the implant, subjecting the photoresist layer to a thermal bake in the presence of hydrogen; and
    removing the photoresist layer, wherein the thermal bake in the presence of hydrogen is a non-plasma process carried out prior to the step of removing the photoresist layer.

11. The method as recited in claim 10 wherein subjecting in the presence of hydrogen includes subjecting in the presence of a forming gas.

12. The method as recited in claim 10 wherein subjecting includes subjecting using a temperature ranging from about 140° C. to about 150° C.

13. The method as recited in claim 10 wherein subjecting includes subjecting for a period of time ranging from about 90 seconds to about 150 seconds.

14. The method as recited in claim 10 wherein implanting the dopant includes implanting the dopant using a dose of about $1.0\text{E}15$ atoms/cm$^2$ or greater.

15. The method as recited in claim 14 wherein the dose causes the photoresist layer to have a hardened skin portion and a bulk portion.

16. The method as recited in claim 15 wherein removing the photoresist layer includes plasma ashing the photoresist layer.

17. The method as recited in claim 16 wherein the plasma ashing includes a high temperature plasma ash using a temperature ranging from about 180° C. to about 270° C.

18. The method as recited in claim 17 wherein the plasma ashing further includes a low temperature plasma ash using a temperature ranging from about 120° C. to about 160° C.

19. The method as recited in claim 18 wherein the low temperature plasma ash occurs before the high temperature plasma ash, the low temperature plasma ash configured to remove at least a portion of the hardened skin portion and the high temperature plasma ash configured to remove any remaining portion of the hardened skin portion and at least a portion of the bulk portion.

20. The method as recited in claim 10 wherein the thermal bake introduces hydrogen into the photoresist layer.

21. A method for manufacturing a semiconductor device, comprising:
    implanting a dopant in a substrate through an opening in a photoresist layer located over the substrate;
    following the implanting, subjecting the photoresist layer to a thermal bake in the presence of hydrogen; and
    removing the photoresist layer using a plasma ashing process, wherein the thermal bake in the presence of hydrogen is a non-plasma process and is carried out prior to the plasma ashing process.

* * * * *